(12) United States Patent
Jeong et al.

(10) Patent No.: US 10,277,009 B2
(45) Date of Patent: Apr. 30, 2019

(54) ELECTROMAGNETIC WAVE REFLECTOR AND OPTICAL DEVICE INCLUDING THE SAME

(71) Applicant: SAMSUNG ELECTRONICS CO., LTD., Suwon-si (KR)

(72) Inventors: Heejeong Jeong, Suwon-si (KR); Chanwook Baik, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/140,654

(22) Filed: Apr. 28, 2016

(65) Prior Publication Data
US 2017/0149211 A1    May 25, 2017

(30) Foreign Application Priority Data
Nov. 19, 2015   (KR) ................. 10-2015-0162841

(51) Int. Cl.
*G02B 5/08* (2006.01)
*H01S 5/34* (2006.01)
(Continued)

(52) U.S. Cl.
CPC ........ *H01S 5/18377* (2013.01); *G02B 5/0833* (2013.01); *H01L 33/46* (2013.01);
(Continued)

(58) Field of Classification Search
CPC ... H01S 5/187; H01S 5/18377; G02B 5/0833; G02B 5/1861
See application file for complete search history.

(56) References Cited

U.S. PATENT DOCUMENTS 5,007,710 A * 4/1991 Nakajima ............ G02B 5/0858
                                                            359/589
6,031,243 A    2/2000 Taylor
(Continued)

FOREIGN PATENT DOCUMENTS

EP    1081816 A2    3/2001
JP    63074005 A *  4/1988 ............. B60R 1/083
(Continued)

OTHER PUBLICATIONS

Lin et al., "Aperiodic and Randomized Dielectric Mirrors: Alternatives to Metallic Back Reflectors for Solar Cells", May 5, 2014, Optics Express, vol. 22, No. S3, A880-A894.*
(Continued)

*Primary Examiner* — Joshua King
(74) *Attorney, Agent, or Firm* — Sughrue Mion, PLLC

(57) ABSTRACT

Provided are electromagnetic wave reflectors and optical devices including the same. An electromagnetic wave reflector may include a plurality of layers which have an aperiodic structure and/or thickness. The plurality of layers may satisfy a condition of spatial coherence with respect to electromagnetic waves. The electromagnetic wave reflector may include a plurality of first material layers including a first material having a first refractive index and a plurality of second material layers including a second material having a second refractive index different from the first refractive index. At least two of the plurality of first material layers may have different thicknesses. At least two of the plurality of second material layers may have different thicknesses. At least one of the plurality of first material layers and at least one of the plurality of second material layers may have different thicknesses.

28 Claims, 18 Drawing Sheets
(2 of 18 Drawing Sheet(s) Filed in Color)

(51) Int. Cl.
*H01L 33/46* (2010.01)
*H01S 5/183* (2006.01)

(52) U.S. Cl.
CPC ............ *H01S 5/18369* (2013.01); *H01S 5/34* (2013.01); *H01S 5/18361* (2013.01)

(56) References Cited

U.S. PATENT DOCUMENTS

| | | | | |
|---|---|---|---|---|
| 6,181,727 | B1* | 1/2001 | Stowell | C23C 14/541 |
| | | | | 359/584 |
| 7,859,754 | B2* | 12/2010 | Falicoff | G02B 5/285 |
| | | | | 359/586 |
| 2004/0012835 | A1* | 1/2004 | Ohbayashi | G02B 5/0833 |
| | | | | 359/237 |
| 2004/0047055 | A1* | 3/2004 | Mizrahi | G02B 5/3041 |
| | | | | 359/883 |
| 2004/0075908 | A1* | 4/2004 | Chen | G02B 5/0825 |
| | | | | 359/584 |
| 2004/0240067 | A1 | 12/2004 | Marusi et al. | |
| 2005/0063061 | A1* | 3/2005 | Grawert | G02B 5/0833 |
| | | | | 359/586 |
| 2005/0271113 | A1* | 12/2005 | Song | H01S 5/02461 |
| | | | | 372/98 |
| 2006/0001959 | A1* | 1/2006 | Senoue | G02B 5/0825 |
| | | | | 359/449 |
| 2006/0171440 | A1* | 8/2006 | Ledentsov | G02B 5/26 |
| | | | | 372/99 |
| 2010/0226402 | A1* | 9/2010 | Maeda | H01S 5/18313 |
| | | | | 372/45.01 |
| 2010/0277637 | A1* | 11/2010 | Katsuda | H04N 5/225 |
| | | | | 348/335 |
| 2011/0037825 | A1* | 2/2011 | Jikutani | B41J 2/442 |
| | | | | 347/243 |
| 2012/0162380 | A1 | 6/2012 | Cho et al. | |
| 2012/0307369 | A1* | 12/2012 | Banerjee | G02B 5/085 |
| | | | | 359/589 |
| 2014/0191196 | A1 | 7/2014 | Cho et al. | |
| 2014/0377459 | A1* | 12/2014 | Kawashima | G01N 21/1702 |
| | | | | 427/162 |
| 2015/0194789 | A1 | 7/2015 | Graham et al. | |
| 2015/0355380 | A1* | 12/2015 | Apitz | G02B 1/11 |
| | | | | 359/601 |
| 2016/0070041 | A1* | 3/2016 | Apitz | G02B 1/14 |
| | | | | 359/589 |

FOREIGN PATENT DOCUMENTS

| | | |
|---|---|---|
| JP | 2005-322857 A | 11/2005 |
| KR | 10-2007-0021599 A | 2/2007 |
| KR | 10-1466703 B1 | 12/2014 |

OTHER PUBLICATIONS

"Vertical-Cavity Surface-Emitting Laser Technology", Princeton Optronics, 2007, 5 pages total.

Jeong, et al.; "Slow-Light-Induced Interference with Stacked Optical Precursors for Square Input Pulses", Optics Letters, vol. 35, No. 2, Jan. 2010, 3 pages total.

Kinoshita et al., "Room Temperature Pulse Operation of GaAs Surface-Emitting Laser by Using TiO2/SiO2 Dielectric Multilayer Reflector", Electronics and Communications in Japan, Part 2, vol. 70, No. 3, Mar. 1, 1987, pp. 59-69, XP000712527.

Communication dated Mar. 30, 2017 issued by the European Patent Office in counterpart European Patent Application No. 16168917.9.

* cited by examiner (A)    (B)

ELECTROMAGNETIC WAVE REFLECTOR AND OPTICAL DEVICE INCLUDING THE SAME

This patent or application file contains at least one drawing executed in color. Copies of this patent or patent application publication with color drawing(s) will be provided by the Office upon request and payment of the necessary fee.

CROSS-REFERENCE TO RELATED APPLICATION

This application claims priority from Korean Patent Application No. 10-2015-0162841, filed on Nov. 19, 2015, in the Korean Intellectual Property Office, the disclosure of which is incorporated herein in its entirety by reference.

BACKGROUND

1. Field

Apparatuses consistent with exemplary embodiments relate to electromagnetic wave reflectors and optical devices including the same.

2. Description of Related Art

The miniaturization and related integration of optical structures and optical systems make it possible to develop products with new functions and to diversify the structure of many products. In this regard, research and development have been actively conducted into implementing super-mini thin-film mirrors, lenses, spectroscopes, and other optical devices. A thin-film mirror (that is, a thin-film type reflector) may have a distributed Bragg reflector (DBR) structure or a high-contrast grating (HCG) structure.

A DBR structure includes several tens of dielectric layers which each satisfy a thickness condition of $\lambda/4$ (where $\lambda$ indicates a wavelength of light). Accordingly, a DBR structure has a relatively large thickness of at least several micrometers (e.g., 5 µm or more) and requires a long processing time, and a large amount of material is required for manufacturing the structure. An HCG structure includes a subwavelength grating (SWG), and an ultra-fine grating in the form of a perfect rectangular parallelepiped is not easy to manufacture. Therefore, a reflector is needed which is easy to manufacture while having a small thickness and also excellent reflection efficiency. Such a reflector could be usefully applied to any of various optical devices.

SUMMARY

One or more exemplary embodiments may provide high-efficiency electromagnetic wave reflectors having superior performance.

One or more exemplary embodiments may provide electromagnetic wave reflectors which are easily manufactured and have small thicknesses.

One or more exemplary embodiments may provide electromagnetic wave reflectors having excellent reflection characteristics.

One or more exemplary embodiments may provide optical devices and electronic devices including improved electromagnetic wave reflectors.

Additional exemplary aspects and advantages will be set forth in part in the description which follows and, in part, will be apparent from the description, or may be learned by practice of the presented embodiments.

According to an aspect of an exemplary embodiment, an electromagnetic wave reflector including a multi-layer structure in which at least two different material layers are stacked alternately is provided, in which the multi-layer structure includes a plurality of first material layers comprising a first material having a first refractive index and a plurality of second material layers comprising a second material having a second refractive index, different from the first refractive index, and at least two of the plurality of first material layers have different thicknesses, at least two of the plurality of second material layers have different thicknesses, and at least one of the plurality of first material layers and at least one of the plurality of second material layers have different thicknesses.

Three of the plurality of first material layers may have three different thicknesses, respectively.

Three of the plurality of second material layers may have three different thicknesses, respectively.

Each of the layers of the multi-layer structure may have a thickness which is different from thicknesses of each other of the plurality of layers.

The first material or the second material may include any one of a dielectric and a semiconductor.

The first material or the second material may include any one of AlGaAs, GaAs, AlAs, InGaAlAs, AlGaInAs, and InP.

The first material or the second material may include any one of Si, Ge, SiOx, SiNx, and an oxide semiconductor, and the oxide semiconductor may include at least one of Zn, In, Ga, and Sn.

The first material may be Si and the second material may be $SiO_2$.

The multi-layer structure may further include at least one third material layer.

The multi-layer structure may further include at least one fourth material layer.

A total number of stacked layers of the multi-layer structure may be equal to or less than about 15.

A total number of stacked layers of the multi-layer structure may be equal to or less than about 10.

A total thickness of the multi-layer structure may be smaller than about 5 µm.

A total thickness of the multi-layer structure may be equal to or smaller than about 3 µm.

A reflectance of the multi-layer structure may be equal to or higher than about 90%.

A reflectance of the multi-layer structure may be equal to or higher than about 95%.

According to an aspect of another exemplary embodiment, an optical device including the electromagnetic wave reflector or a plurality thereof is provided.

According to an aspect of another exemplary embodiment, an electromagnetic wave reflector including a multi-layer structure in which at least two different material layers are stacked alternately is provided, in which at least three layers of the multi-layer structure have different thicknesses from one another to satisfy a spatial coherence condition, a total number of stacked layers of the multi-layer structure is equal to or less than about 15, and a reflectance of the multi-layer structure is equal to or higher than about 90%.

A total thickness of the multi-layer structure may be smaller than about 5 µm.

A total thickness of the multi-layer structure may be equal to or smaller than about 3 µm.

The multi-layer structure may include a plurality of first material layers including a first material having a first refractive index and a plurality of second material layers including a second material having a second refractive index, different from the first refractive index, and at least two of the plurality of first material layers may have different thicknesses, and at least two of the plurality of second material layers may have different thicknesses.

The multi-layer structure may further include at least one third material layer.

The multi-layer structure may further include at least one fourth material layer.

Each of the layers of the multi-layer structure may have a thickness different from thicknesses of each other of the layers.

According to an aspect of another exemplary embodiment, an optical device including the electromagnetic wave reflector or a plurality thereof is provided.

According to an aspect of another exemplary embodiment, an optical device may include a first reflective layer, a second reflective layer spaced apart from the first reflective layer; and an active layer disposed between the first reflective layer and the second reflective layer, wherein at least one of the first reflective layer and the second reflective layer includes a multi-layer structure in which at least two different material layers are stacked alternately, wherein the multi-layer structure includes a plurality of first material layers including a first material having a first refractive index and a plurality of second material layers including a second material having a second refractive index, different from the first refractive index, and wherein at least two of the plurality of first material layers have different thicknesses, at least two of the plurality of second material layers have different thicknesses, and at least one of the plurality of first material layers and at least one of the plurality of second material layers have different thicknesses.

The first reflective layer may include a first multi-layer structure corresponding to the multi-layer structure, the second reflective layer may include a second multi-layer structure corresponding to the multi-layer structure, and the first multi-layer structure and the second multi-layer structure may have stacked structures which are symmetrical to each other with respect to the active layer.

The first reflective layer may include a first multi-layer structure corresponding to the multi-layer structure, the second reflective layer may include a second multi-layer structure corresponding to the multi-layer structure, and the first multi-layer structure and the second multi-layer structure may have the same stacked structures with respect to a bottom surface of the optical device.

The first reflective layer and the second reflective layer may have the same structure and the same thickness.

The first reflective layer may include the multi-layer structure, and the second reflective layer may include a metallic material layer.

Three layers of the multi-layer structure may have three different thicknesses, respectively.

A total number of stacked layers of the multi-layer structure may be equal to or less than about 15.

A total number of stacked layers of the multi-layer structure may be equal to or less than about 10.

A total thickness of the multi-layer structure may be smaller than about 5 µm.

A total thickness of the multi-layer structure may be equal to or smaller than about 3 µm.

A reflectance of the multi-layer structure may be equal to or higher than about 90%.

A reflectance of the multi-layer structure may be equal to or higher than about 95%.

The optical device may include a surface-emitting laser device, for example.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
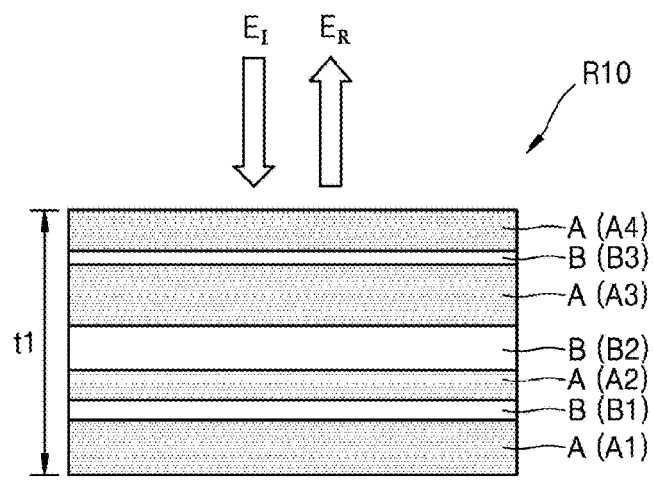
FIG. 1 is a cross-sectional view of an electromagnetic wave reflector according to an exemplary embodiment.

Various exemplary embodiments will now be described more fully with reference to the accompanying drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized features (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present inventive concept. As used herein, the term "and/or" includes any and all combinations of one or more of the associated listed items. Expressions such as "at least one of," when preceding a list of elements, modify the entire list of elements and do not modify the individual elements of the list.

Hereinafter, electromagnetic wave reflectors and optical devices including the electromagnetic wave reflectors according to various exemplary embodiments will be described in detail with reference to the accompanying drawings. The widths and thicknesses of layers or regions shown in the drawings may be exaggerated for clarity and convenience of explanation. Throughout the present disclosure, the same reference numerals denote the same elements.

FIG. 1 is a cross-sectional view of an electromagnetic wave reflector R10 according to an exemplary embodiment.

Referring to FIG. 1, the electromagnetic wave reflector (hereinafter, referred to as a reflector) R10 may include a multi-layer structure in which at least two different material layers are stacked alternately. For example, the reflector R10 may include a structure in which a first material layer A, including a first material, and a second material layer B, including a second material, are stacked alternately. The first material layer A may have a first refractive index, and the second material layer B may have a second reflective index which is different from the first refractive index. The reflector R10 may include a plurality of first material layers A that are spaced apart from each other and may include a plurality of second material layers B, each disposed between a pair of the plurality of first material layers A. The plurality of first material layers A may be referred to as A1, A2, A3, and A4, from bottom to top, and likewise, the plurality of second material layers B may be referred to as B1, B2, and B3, from bottom to top, as shown in FIG. 1. The layers A1, A2, A3, and A4 may be referred to as layers 1-1, 1-2, 1-3, and 1-4, respectively, and the layers B1, B2, and B3 may be referred to as layers 2-1, 2-2, and 2-3, respectively.

The layers of the reflector R10 may have a non-periodic (also called aperiodic) thicknesses, such that the reflector R10 has a non-periodic structure satisfying a condition of spatial coherence. In this regard, at least two of the plurality of first material layers A may have thicknesses different from each other. At least two of the plurality of second material layers B may also have thicknesses different from that of the remaining layers. At least one of the plurality of first material layers A may have a thickness different from that of the remaining layers, and at least one of the plurality of second material layers B may have a thickness different from that of the remaining layers B. If three or more first material layers A are provided, at least three of the plurality of first material layers A may have thicknesses different from that of the remaining layers. If three or more second material layers B are provided, at least three of the plurality of second material layers B may have thicknesses different from that of the remaining layers. For example, each of the layers of the reflector R10 may have a thickness different from each other of the layers. In this sense, the reflector R10 may be regarded as having a non-periodic/aperiodic design which satisfies the condition of spatial coherence. The spatial coherence will be described later in detail.

In the current embodiment, the layer A1 may be thicker than the layer B1; the layer B1 may be thinner than the layer A2; and the layer A2 may be thinner than the layer B2. The layer B2 may be thinner than the layer A3; they layer A3 may be thicker than the layer B3; and the layer B3 may be thinner than the layer A4. The layer A1 may be thicker than the layer A2; the layer A2 may be thinner than the layer A3; and the layer A3 may be thicker than the layer A4. The layer B1 may be thinner than the layer B2 and the layer B2 may be thicker than the layer B3. The layer A3 may be the thickest layer, and the layer B3 may be thinnest layer. However, the relative thicknesses of the material layers are merely exemplary and may vary.

The first material layer A may be formed of a first material having a first refractive index, and the second material layer B may be formed of a second material having a second refractive index. The first refractive index of the first material layer A may be greater than the second refractive index of the second material layer B. The first material layer A or the second material layer B may include one of a dielectric and a semiconductor. For example, the first material layer A or the second material layer B may include any one of AlGaAs, GaAs, AlAs, InGaAlAs, AlGaInAs, and InP. More specifically, a combination of the first material layer A and the second material layer B may be AlGaAs and GaAs, AlAs and GaAs, InGaAlAs and InP, AlGaInAs and InP, or the like. For light having a wavelength of 850 nm, a refractive index of AlGaAs may be about 2.92 and a refractive index of GaAs may be about 3.42. In another example, the first material layer A or the second material layer B may include any one of Si, Ge, SiOx, SiNx, and an oxide semiconductor. Herein, the oxide semiconductor may include at least one of Zn, In, Ga, and Sn. For example, the oxide semiconductor may include ZnO, InSnO, GaInZnO, HfInZnO, or the like. The above-mentioned Si may be polysilicon (poly-Si) or amorphous silicon (a-Si). For example, the combination of the first material layer A and the second material layer B may be Si and $SiO_2$. $SiO_2$ may be replaced with another dielectric having a lower refractive index than that of Si. The refractive index of the another dielectric may be from about 1 to about 2 or from about 1 to about 1.5. The above-mentioned SiNx may be $Si_3N_4$ and a refractive index thereof may be from about 2 to about 2.4. The detailed materials of the first material layer A and the second material layer B are merely exemplary, and other various materials may be used.

A total number of stacked layers of the reflector R10, that is, a total number of material layers of the reflector R10 may be equal to or less than about 15 or about 10. A total thickness t1 of the reflector R10 may be less than about 5 μm. The total thickness t1 of the reflector R10 may be equal to or less than about 3 μm, and may be equal to or less than about 2 μm according to circumstances. The reflectance of the reflector R10 may be equal to or higher than about 90%. The reflectance of the reflector R10 may be equal to or higher than about 95%. In the reflector R10 according to an exemplary embodiment, a total number of stacked layers may be less than about 15 or about 10, and a total thickness t1 may be less than about 5 μm or be equal to or less than about 3 μm, and the reflector R10 may have a high reflectance of about 90% or about 95% or higher.

Since a conventional DBR structure includes several tens of dielectric layers (about 40 layers, for example) satisfying the thickness condition of λ/4 (where λ indicates a wavelength of light), a conventional DBR structure would need a long processing time, its manufacturing would require a large amount of material, and it would also have a relatively large thickness of 5 μm or more. In such a DBR structure, the number of stacked dielectric layers must to be increased to obtain a reflectance of a desired level, resulting in an increase in total thickness. Meanwhile, a conventional HCG structure art includes a SWG, and an ultra-fine grating in the form of a perfect rectangular parallelepiped is not easy to manufacture. In order to form the HCG structure, highly sophisticated electron-beam lithography may be required.

However, according to one or more exemplary embodiments described herein, the reflector R10 is easy to manufacture in spite of its thin thickness and also has superior reflection characteristics. The material layers A and B are simply stacked without using a subwavelength grating, and are controlled so that the layers have non-periodic thicknesses resulting in a non-periodic overall structure, thereby implementing a reflector R10 having a high reflectance of about 90% or higher in spite of a small number of stacked layers, for example, about 15 layers or less. Thus, the reflector R10 is much easier to manufacture than a conventional HCG structure and has superior reflection characteristics despite a much smaller thickness than a conventional DBR structure. Moreover, the reflector R10 may be formed using a small amount of materials and a short processing time, thereby largely reducing a production cost.

In FIG. 1, $E_I$ represents an incident electromagnetic wave (which will hereinafter be referred to as an incident wave), and $E_R$ represents a reflected electromagnetic wave (which will hereinafter be referred to as a reflected wave). For example, under a given condition, about 90% or more of the incident wave $E_I$ may be reflected by the reflector R10, becoming the reflected wave $E_R$. Herein, the incident wave $E_I$ may fall within any of various wavelength bands, such as microwave, infrared, visible, ultraviolet, and so forth.

Figure 2:
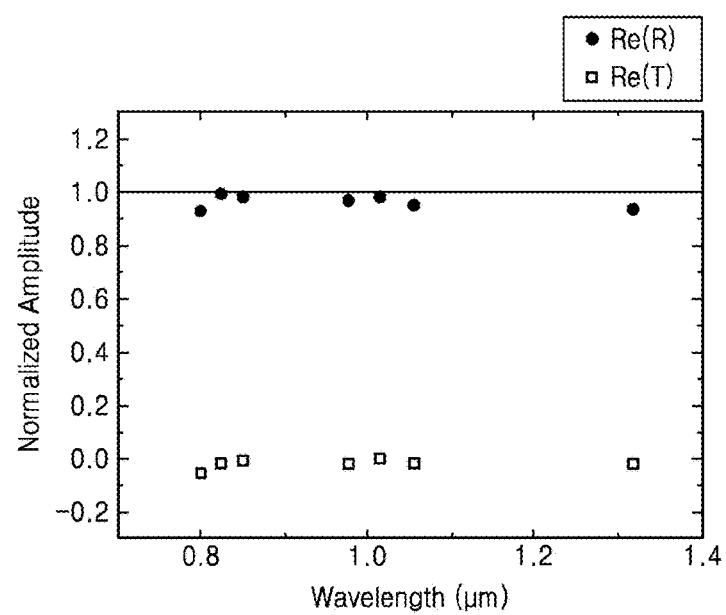
FIG. 2 is a graph showing results of measuring reflection and transmission characteristics of a reflector according to an exemplary embodiment with respect to a wavelength of an incident wave (incident light)

FIG. 2 is a graph showing the results of measuring the reflection and transmission characteristics of a reflector according to an exemplary embodiment with respect to a wavelength of an incident wave (incident light). The results shown in FIG. 2 are associated with the reflector R10 having the structure shown in FIG. 1, in which the first material layer A comprises Si and the second material layer B comprises $SiO_2$. The thicknesses of the layers A1, B1, A2, B2, A3, B3, and A4 are 600.00 nm, 235.23 nm, 369.71 nm, 504.167 nm, 638.613 nm, 152.28 nm, and 500.00 nm, respectively. In this case, the total thickness (t1 of FIG. 1) of the reflector R10 is 3 μm. In FIG. 2, Re(R) represents a normalized reflectance, and Re(T) represents a normalized transmittance. That is, Re(R) represents an amplitude of a reflected wave, which is normalized to an amplitude of an incident wave, and Re(T) represents an amplitude of a transmitted wave, which is normalized to the amplitude of the incident wave.

Referring to FIG. 2, it can be seen that Re(R) has a value of 1 or close to 1 in a particular wavelength region. When Re(R) has a value close to 1, it means that most parts of the incident wave are reflected. In other words, the reflector has a reflectance close to 100%. It can also be seen that Re(T) has a value of 0 or close to 0 in a particular wavelength region. When Re(T) has a value close to 0, it means that most parts of the incident wave are not transmitted. Thus, in the particular wavelength region, the incident wave is mostly not transmitted and may be mostly reflected.

Figure 3:
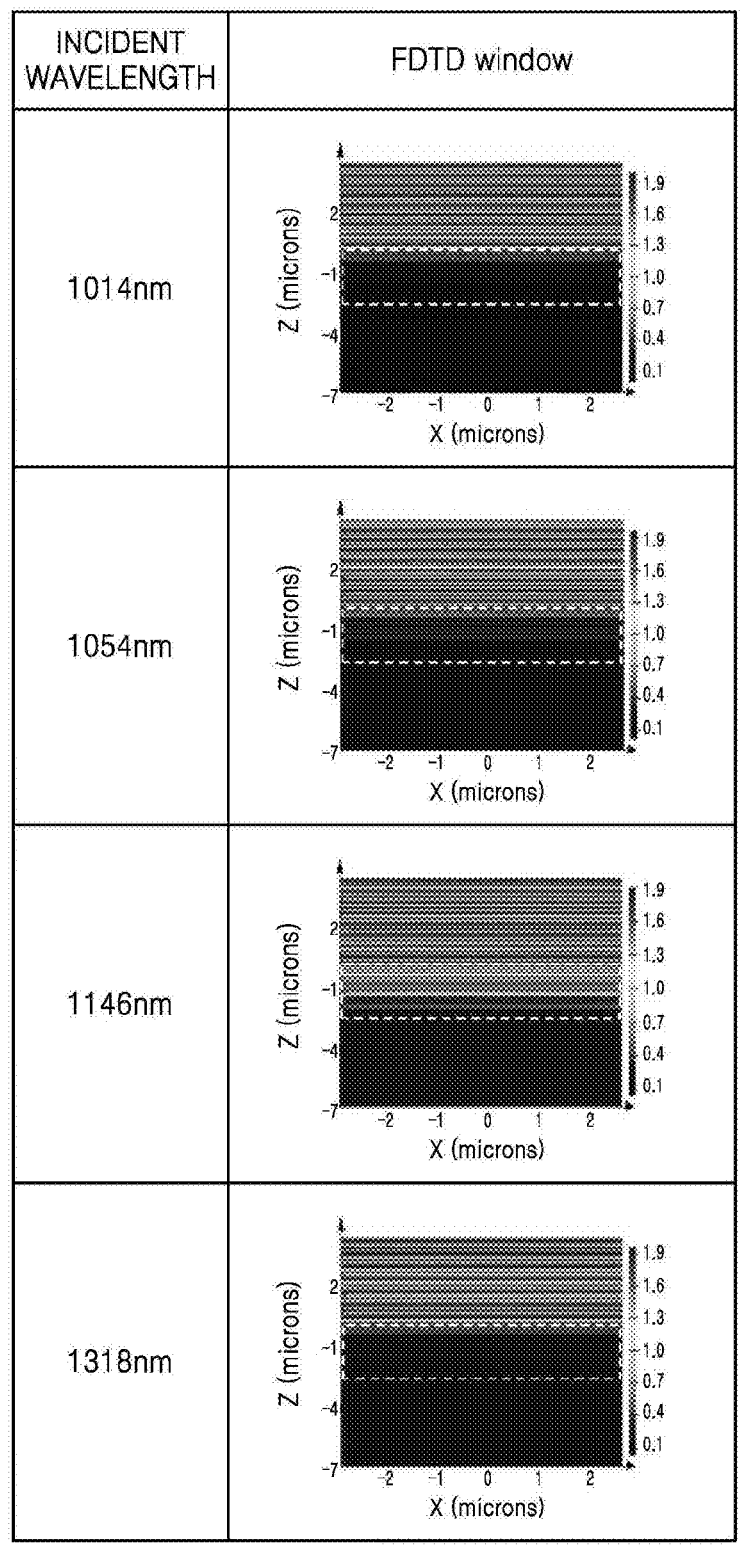
FIG. 3 includes graphs showing a result of evaluating reflection characteristics of a reflector according to an exemplary embodiment with respect to a wavelength of an incident wave (incident light) by using finite-difference time-domain (FDTD) simulation.

FIG. 3 includes graphs showing a result of an evaluation of reflection characteristics of a reflector with respect to a wavelength of incident light, according to an exemplary embodiment, by using a finite-difference time-domain (FDTD) simulation. Results shown in FIG. 3 are associated with a reflector having the same structure as described above with reference to FIG. 2. In the graphs of FIG. 3, a rectangular area marked with white dotted lines indicates a reflector area.

Referring to FIG. 3, the reflector reflects most parts of an incident wave (incident light) while hardly transmitting the incident wave, such that the waveform/amplitude of the reflected light is shown as stripes above the reflector and is not shown under the reflector. Such a result may correspond to the result shown in FIG. 2. At several wavelengths between a visible ray (VIS) area and an infrared ray (IR) area, the incident wave and the reflected wave are in phase, such that the amplitude may be doubled. In other words, in the reflected area, an E-field amplitude of 200% may be obtained.

Figure 4:
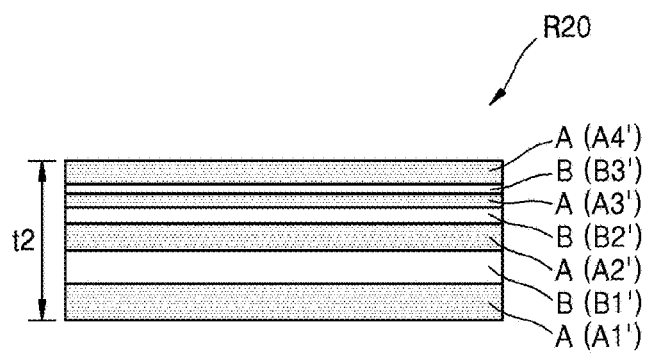
FIG. 4 is a cross-sectional view of an electromagnetic wave reflector according to another exemplary embodiment.

FIG. 4 is a cross-sectional view of an electromagnetic wave reflector R20 according to another exemplary embodiment.

Referring to FIG. 4, the electromagnetic wave reflector (which will hereinafter be referred to as a reflector) R20 is similar to the reflector R10 of FIG. 1, but may also have a structure modified from that of the reflector R10. The reflector R20 may include a plurality of first material layers A spaced apart from each other and a plurality of second material layers B, each provided between a pair of the plurality of first material layers A. The plurality of first material layers A may be referred to as A1', A2', A3', and A4', respectively, from bottom to top, as shown in FIG. 4, and likewise, the plurality of second material layers B may be referred to as B1', B2', and B3', respectively, from bottom to top. The thicknesses of the respective layers A1', B1', A2', B2', A3', B3', and A4' and the ratios therebetween may be different from those for the layers A1, B1, A2, B2, A3, B3, and A4 of FIG. 1.

In the current embodiment, the layer A1' may be thicker than the layer B1'; the layer B1' may be thicker than the layer A2'; and the layer A2' may be thicker than the layer B2'. The layer B2' may be thicker than the layer A3'; the layer A3' may be thicker than the layer B3'. The layer A4' may be thicker than the layer B3'. The layer A1' may be thicker than the layer A2'; the layer A2' may be thicker than the layer A3'; and the layer A3' may be thinner than the layer A4'. The layer B1' may be thicker than the layer B2'; the layer B2' may be thicker than the layer B3'. The layer A1' may be thickest layer, and the layer B3' may be thinnest layer. In this case, a total thickness t2 of the reflector R20 may be equal to or less than about 2 μm. The total thickness t2 of the reflector R20 may be from about 1 μm to about 2 μm. The reflector R20 may have a thickness smaller than that of the reflector R10 of FIG. 1.

Figure 5:
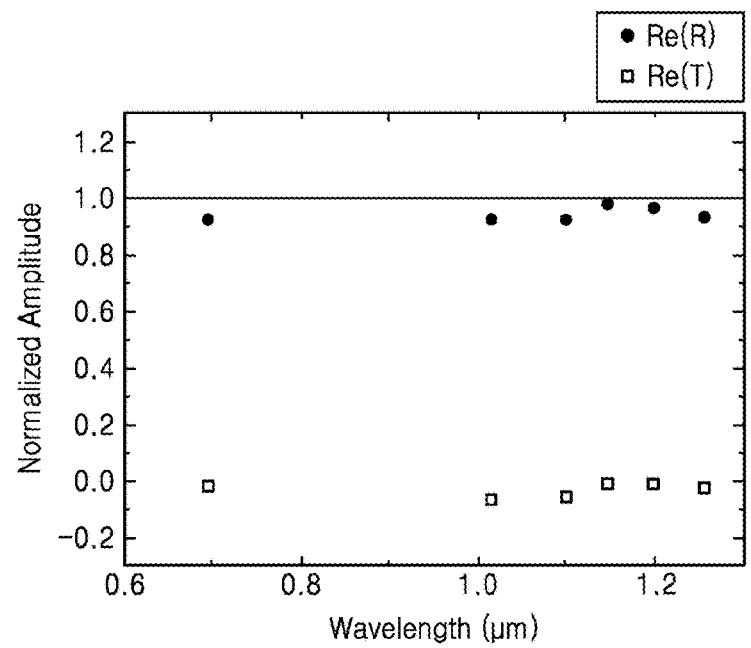
FIG. 5 is a graph showing results of measuring reflection and transmission characteristics of a reflector according to another exemplary embodiment with respect to a wavelength of an incident wave (incident light)

FIG. 5 is a graph showing results of measuring reflection and transmission characteristics of a reflector according to another exemplary embodiment with respect to a wavelength of incident light. The results shown in FIG. 5 are associated with the reflector R20 having the structure of FIG. 4, in which the first material layer A comprises Si, and the second material layer B comprises $SiO_2$. The thicknesses of the layers A1', B1', A2', B2', A3', B3', and A4' are about 386.53 nm, about 319.306 nm, about 252.083 nm, about 184.856 nm, about 117.615 nm, about 50.00 nm, and about 250.00 nm, respectively. The total thickness (t2 of FIG. 4) of the reflector R20 is about 1.5 μm.

Referring to FIG. 5, results similar to those of FIG. 2 are shown, but a wavelength band showing superior reflection characteristics differs from that of FIG. 2. From this result, it can be seen that the reflection wavelength and reflection characteristics may be controlled by changing the thicknesses of layers of a reflector and/or ratios of the thicknesses. In addition, it can be seen that a high reflectance of about 90% or higher or about 95% or higher may be obtained by using a reflector having a small number of stacked layers, for example, about 10 layers or less and a small thickness from about 1 μm to about 2 μm.

Thus, according to at least one exemplary embodiment, since a max amplitude may be generated at an interface (surface) of a particular layer (or several particular layers), instead of all layers, by using coherent interaction between a medium (a dielectric or a semiconductor) and an electromagnetic wave, a large number of stacked layers are not required as in a conventional DBR structure. In the interaction between the electromagnetic wave and the medium, the absorption or emission of the electromagnetic wave may be generated on a plurality of layers included in the medium, and due to coherent interaction between the absorption or emission, amplification based on an in-phase effect may occur at an interface of a particular layer (or several particular layers), resulting in superior reflection characteristics. To this end, materials and thicknesses of the layers included in the medium may be appropriately selected and controlled in association with the wavelength of the electromagnetic wave. According to this principle, an electromagnetic wave reflector may be implemented which has about 15 or 10 stacked layers or less and also has excellent reflection characteristics despite a thickness equal to or less than about 3 μm or about 2 μm. Due to having a structure including a plurality of stacked layers without using a grating structure, the reflector may be easily manufactured. Thus, the reflector may be easy to manufacture despite a small thickness and may also have a superior reflection efficiency.

According to at least one exemplary embodiment, both a real part n and an imaginary part k of a refractive index (a complex index of refraction) may be taken into account to determine thicknesses of a plurality of layers included in a medium. Herein, the imaginary part k is associated with absorption of light and a loss of energy, and when the imaginary part k as well as the real part n are considered, it means that refraction characteristics of light as well as absorption characteristics of the light are considered. Thus, according to an exemplary embodiment, constructive interference associated with absorption and emission of light may be obtained, and consequently, the aforementioned spatial coherence conditions may be satisfied.

Figure 18:
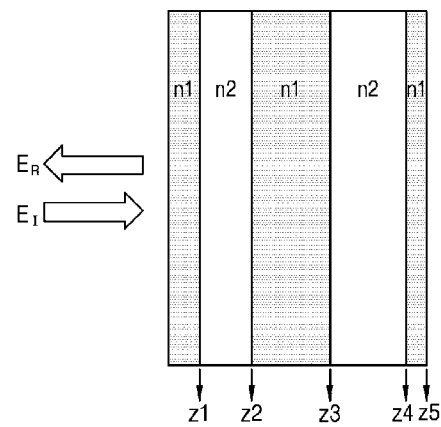
FIG. 18 is a cross-sectional view for describing design conditions of an electromagnetic wave reflector according to another exemplary embodiment.

According to an exemplary embodiment, thicknesses of a plurality of layers included in a reflector may be determined as below. The following equations will be described with reference to FIG. 18 in which a material layer having a refractive index of n1 and a material layer having a refractive index of n2 are stacked alternately.

$$z_i = \frac{j_{1,i}^2}{Y} \qquad (1)$$

$$Y = \frac{x_i^2}{z_1} \qquad (2)$$

-continued $$x_i = \sqrt{2\alpha_0 z_i \delta T} \qquad (3)$$

In Equation (1), $z_i$ represents a thickness of an $i^{th}$ layer (see FIG. 18), and $j_{1,i}$ represents an $i^{th}$ zero point of $J_1(x)$ which is a primary Bessel function. Y of Equation (1) may be expressed as Equation (2) and $x_i$ of Equation (2), which is determined considering absorption characteristics and transmission characteristics of a medium (a material layer), may be expressed as Equation (3). In Equation (3), $\alpha_0$ represents an absorption coefficient of the medium (the material layer), $\delta$ represents a half width at half maximum (HWHM) of an absorption spectrum of the medium, and T represents a time during which light passes through the medium.

As such, by using Equations (1) through (3), thicknesses (e.g., z1, z2, z3, z4, and z5 of FIG. 18) of a plurality of layers included in a reflector may be obtained. According to circumstances, after the thickness z1 is set to an arbitrary value, the thicknesses z2, z3, z4, and z5 may be derived from the arbitrary value z1 by using the above equations. According to circumstances, after the thicknesses z1, z2, z3, z4, and z5 are arbitrarily set, a wavelength of an electromagnetic wave (light) satisfying the coherence conditions with respect to the thicknesses z1, z2, z3, z4, and z5 may be derived.

A conventional DBR structure may operate according to a principle which is totally different from that of one or more exemplary embodiments. A conventional DBR structure may include several tens of dielectric layers satisfying the thickness condition of $\lambda/4$, such that reflection is made at all interfaces and the interference between/among reflected light may be used. Thus, to obtain a high reflectance, a large number of stacked layers, for example more than several tens of layers, may be needed. However, since a reflector according to an exemplary embodiment herein utilizes properties of 'spatial coherence' which is different from the thickness condition of $\lambda/4$, an electromagnetic wave reflector having about 15 or 10 stacked layers or less and having excellent reflection characteristics despite a thickness from about 3 µm to about 2 µm or less may be easily implemented. Such an electromagnetic wave reflector may be referred to as a 'spatially coherent reflector (SCR)' or a 'spatially coherent stack (SCS)'.

According to an exemplary embodiment, the reflectors R10 and R20 may further include at least one other material layer in addition to the first material layer A and the second material layer B. Such a modified example will be described in more detail with reference to FIGS. 6 through 10.

Figure 6:
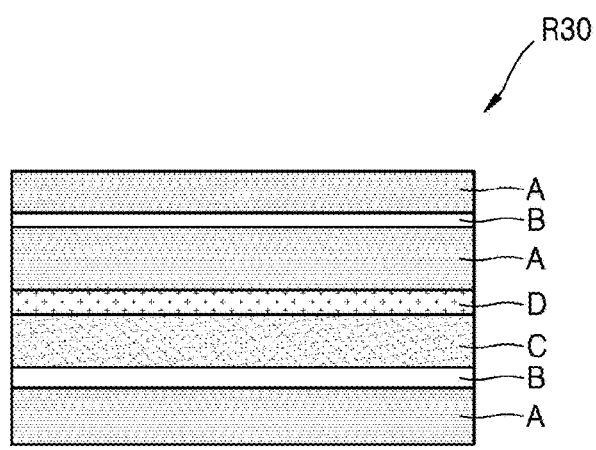
FIG. 6 is a cross-sectional view of an electromagnetic wave reflector according to another exemplary embodiment.

FIG. 6 is a cross-sectional view of an electromagnetic wave reflector R30 according to another exemplary embodiment.

Referring to FIG. 6, the reflector R30 may include a first material layer A and a second material layer B which are stacked alternately, and may further include at least one third material layer C and at least one fourth material layer D. The third material layer C may include a third material having a third refractive index that is different from the refractive indices of the first material layer A and the second material layer B. The fourth material layer D may include a fourth material having a fourth refractive index that is different from the refractive indices of the first material layer A, the second material layer B, and the third material layer C. For example, the third material layer C or the fourth material layer D may include one of AlGaAs, GaAs, AlAs, InGaAlAs, AlGaInAs, and InP, or one of Si, Ge, SiOx, SiNx, and an oxide semiconductor. However, this is merely an example, and the materials of the third material layer C and the fourth material layer D may vary.

The reflector R30 may have, for example, a stacked structure, A/B/C/D/A/B/A, or a similar stacked structure. The structure of the reflector R30 may be similar to the structure of FIG. 1 but in which a pair of a first material layer A and a second material layer B is replaced with a pair of a third material layer C and a fourth material layer D. The third material layer C may have a thickness that is different from a thickness of at least one of the plurality of first material layers A, and the fourth material layer D may have a thickness that is different from a thickness of at least one of the plurality of second material layers B. The third material layer C may have a thickness that is different from that of the fourth material layer D. However, according to circumstances, the third material layer C may have a thickness that is the same as that of one of the plurality of first material layers A or one of the plurality of second material layers B. The fourth material layer D may also have a thickness that is the same as that of one of the plurality of first material layers A or one of the plurality of second material layers B.

Figure 7:
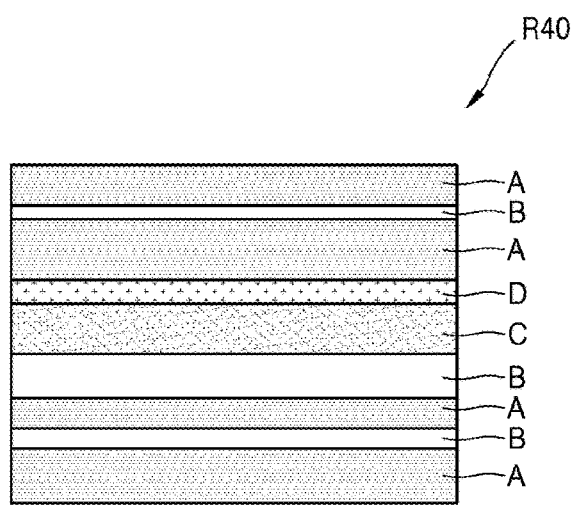
FIG. 7 is a cross-sectional view of an electromagnetic wave reflector according to another exemplary embodiment.

FIG. 7 is a cross-sectional view of an electromagnetic wave reflector R40 according to another exemplary embodiment.

Referring to FIG. 7, the reflector R40 may have a stacked structure A/B/A/B/C/D/A/B/A or a similar stacked structure. The structure of the reflector R40 may have the structure of FIG. 1 but in which a pair of a third material layer C and a fourth material layer D is added in the middle of the structure of FIG. 1.

Figure 8:
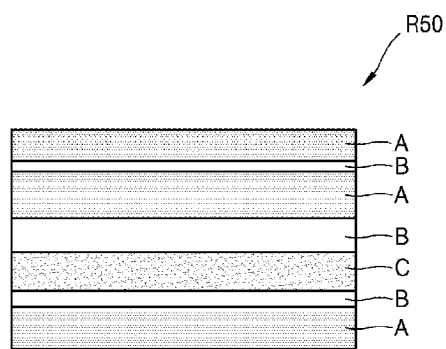
FIG. 8 is a cross-sectional view of an electromagnetic wave reflector according to another exemplary embodiment.
Figure 9:
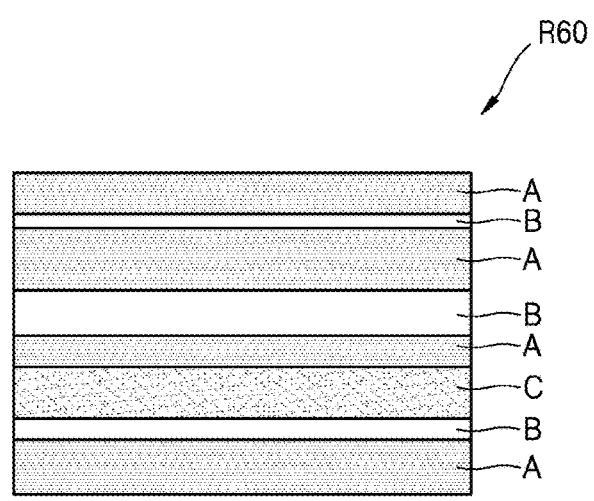
FIG. 9 is a cross-sectional view of an electromagnetic wave reflector according to another embodiment.

According to another exemplary embodiment, in the structures of FIGS. 6 and 7, one of the third material layer C and the fourth material layer D may be used and the other may be omitted. For example, as shown in FIG. 8, a reflector R50 may have a stacked structure A/B/C/B/A/B/A or a similar stacked structure. The structure of the reflector R50 is similar to the structure of FIG. 1 but in which one first material layer A (that is, the layer A2) is replaced with a third material layer C. As shown in FIG. 9, a reflector R60 may have a stacked structure A/B/C/A/B/A/B/A or a similar stacked structure. The structure of the reflector R60 may be similar to the structure of FIG. 1 in which the third material layer C is added in the middle of the structure of FIG. 1.

Figure 10:
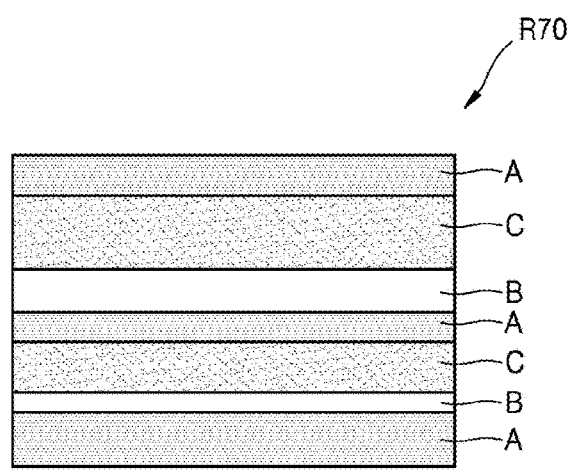
FIG. 10 is a cross-sectional view of an electromagnetic wave reflector according to another exemplary embodiment.

According to another exemplary embodiment, the reflector may include a structure in which three or more different material layers are stacked alternately. For example, as shown in FIG. 10, a reflector R70 may have a structure in which a first material layer A, a second material layer B, and a third material layer C are alternately stacked repeatedly. For example, the reflector R70 may have a stacked structure A/B/C/A/B/C/A or a similar stacked structure. The plurality of third material layers C may have different thicknesses. Although not shown, a reflector having a structure in which the first material layer A, the second material layer B, the third material layer C, and the fourth material layer D are alternately stacked repeatedly may be provided. Other various modified structures may be possible.

When the reflectors R30 through R70 are configured using three or more types of material layers are configured as shown in FIGS. 6 through 10, thicknesses of the material layers may be set using the aforementioned Equations (1) through (3). According to circumstances, conditional equations modified from Equations (1) through (3) may be used.

In the exemplary embodiments of FIGS. 1, 4, and 6 through 10, the first material layer A may be disposed on both ends (that is, a bottom end and a top end) of the reflectors R10 through R70, and the first material layer A may have a relatively high refractive index. When the first material layer A having a relatively high refractive index is disposed on both ends of the reflectors R10 through R70, improved reflection characteristics may be obtained. However, this is merely an example, and the type of a material layer disposed on the ends of the reflectors R10 through R70 may vary. The types of material layers disposed on one end (a bottom end) and another end (a top end) of the reflectors R10 through R70 may be different from each other.

Figure 11:
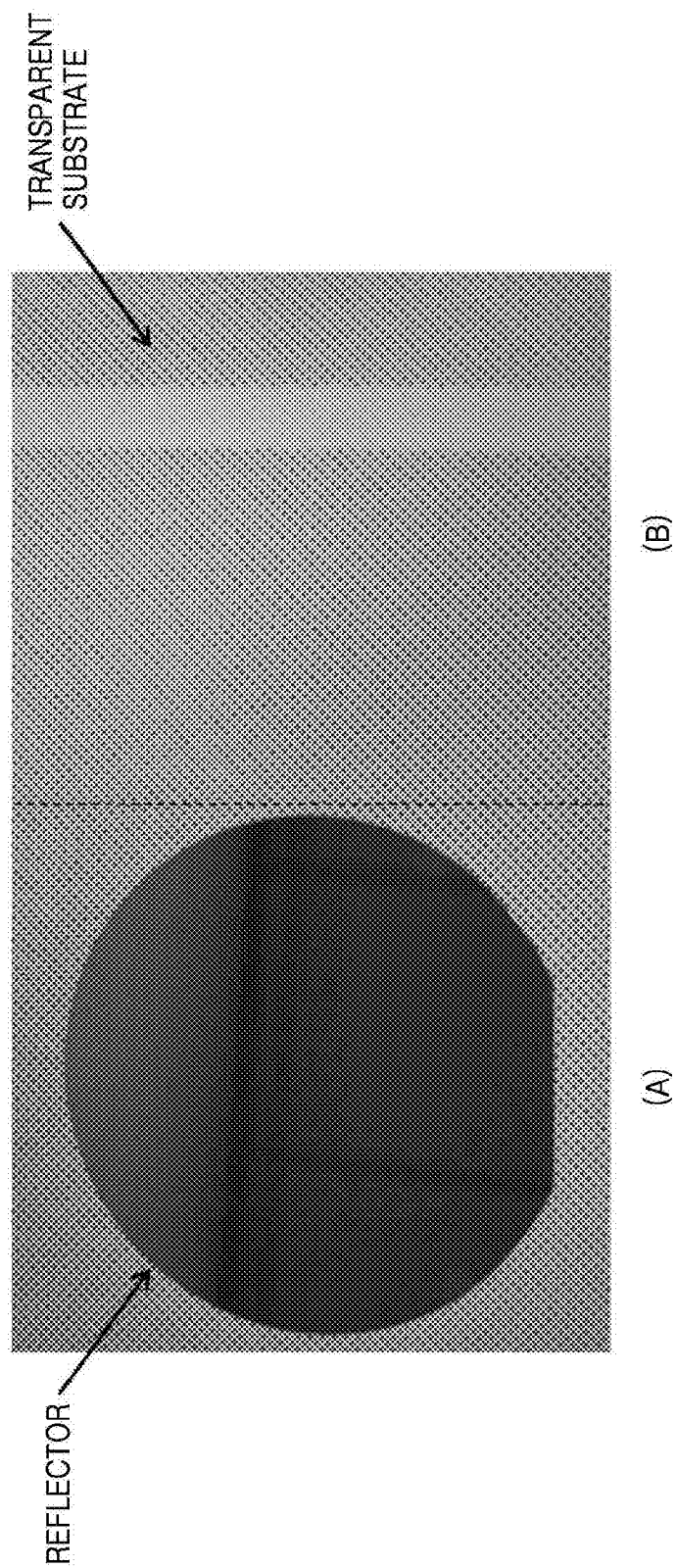
FIG. 11 shows images obtained by photographing a reflector manufactured according to an exemplary embodiment and a transparent substrate compared with the reflector.
Figure 12:
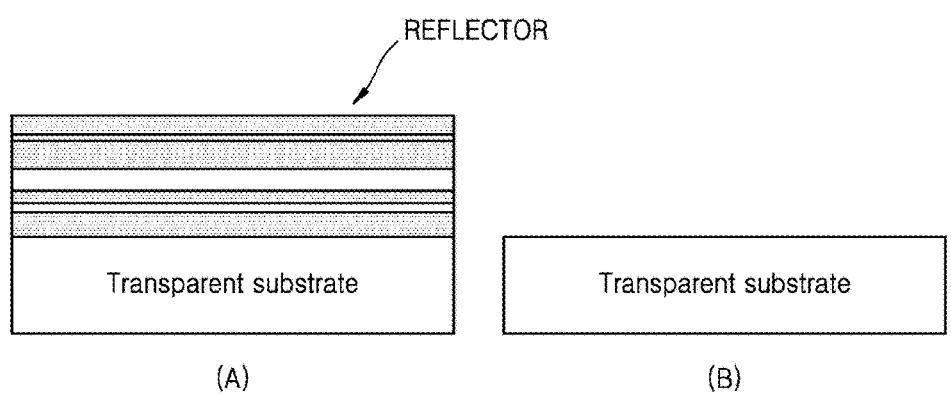
FIG. 12 is a cross-sectional view of cross-sectional structures of a reflector and a transparent substrate illustrated in FIG. 11.

FIG. 11 shows images obtained by photographing a reflector manufactured according to an exemplary embodiment and, for purposes of comparison, a transparent substrate. FIG. 12 is a cross-sectional view of the cross-sectional structures of the exemplary reflector and the transparent substrate photographed in FIG. 11. In FIGS. 11 and 12, (A) is associated with a reflector and (B) is associated with a transparent substrate. The transparent substrate is a quartz substrate, and the reflector is disposed on a transparent substrate (the quartz substrate).

Referring to FIGS. 11 and 12, since the transparent substrate in (B) is transparent, the edges of the transparent substrate do not appear clearly in the image of FIG. 11, whereas, since the reflector in (A) reflects light, the reflector shows characteristics similar to those of a mirror.

The electromagnetic wave reflector according to the aforementioned exemplary embodiments may be used in conjunction with any of various optical devices for various purposes. Hereinbelow, an optical device utilizing an exemplary electromagnetic wave reflector will be described.

Figure 13:
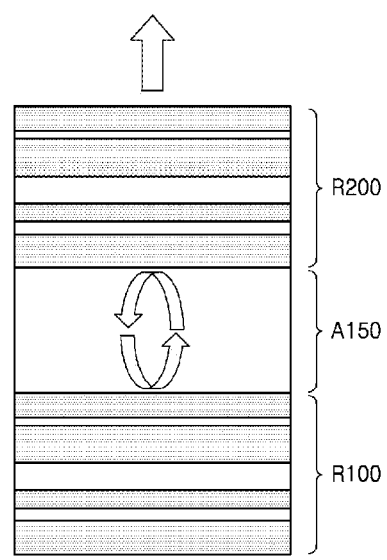
FIG. 13 is a cross-sectional view of an optical device including an electromagnetic wave reflector according to an exemplary embodiment.

FIG. 13 is a cross-sectional view of an optical device including an electromagnetic wave reflector according to an exemplary embodiment.

Referring to FIG. 13, the optical device may include a first reflective layer R100 and a second reflective layer R200 spaced apart from the first reflective layer R100, and an active layer A150 provided between the first reflective layer R100 and the second reflective layer R200. The active layer A150 may be a gain medium. The active layer A150 may be a laser cavity. The active layer A150 may include, for example, a quantum well or a quantum dot, and may be a single-layer or comprise a multi-layered structure. At least one of the first reflective layer R100 and the second reflective layer R200 may have the structure of one of the reflectors R10 through R70 according to the exemplary embodiments described with reference to FIGS. 1 through 10 or a structure modified therefrom. The optical device may be a surface-emitting laser device. More specifically, the optical device may be a vertical-cavity surface-emitting laser (VCSEL) device. In FIG. 13, an arrow shown above the optical element indicates an emitted laser beam, and arrows shown within the active layer A150 indicate light resonating between the two reflective layers R100 and R200. The light (laser beam) which resonates and is amplified between the two reflective layers R100 and R200 may be emitted outside the optical device if a particular condition is satisfied.

In the current exemplary embodiment, the first reflective layer R100 may have a multi-layer structure corresponding to that of FIG. 1, and the second reflective layer R200 may also have the multi-layer structure corresponding to that of FIG. 1. The multi-layer structure of the first reflective layer R100 and the multi-layer structure of the second reflective layer R200 may be the same stacked structure with respect to a bottom surface of the optical device. In other words, the first reflective layer R100 and the second reflective layer R200 have substantially the same layers stacked in substantially the same order and direction, from bottom to top.

In a laser device using a conventional DBR structure, a lower DBR structure (mirror) and an upper DBR structure (mirror) will different numbers of stacked layers and different thicknesses. A conventional upper DBR structure has a smaller number of stacked layers and is thinner as compared to a conventional lower DBR structure, such that laser extraction performance through the upper DBR structure may be secured. However, when the upper DBR structure and the lower DBR structure are asymmetric in this way, the inner resonance efficiency may be degraded. As a result, there is a trade-off between the inner resonance efficiency and the laser extraction efficiency, making it difficult to guarantee optimal device performance.

However, according to the current exemplary embodiment, as shown in FIG. 13, the first reflective layer R100 and the second reflective layer 200 have the same stacked structure and the same thickness. As such, when the first reflective layer R100 and the second reflective layer 200 have the same stacked structure, a superior inner resonance efficiency may be easily obtained. Moreover, with the non-periodic/aperiodic structure inside each of the reflective layers R100 and R200, excellent laser extraction efficiency may also be obtained. Thus, a laser device having high laser extraction efficiency while having superior inner resonance efficiency may be easily implemented. Moreover, the first reflective layer R100 and the second reflective layer R200 are easy to manufacture despite having small thicknesses and also have superior reflection characteristics, and may provide various benefits in this sense.

Figure 14:
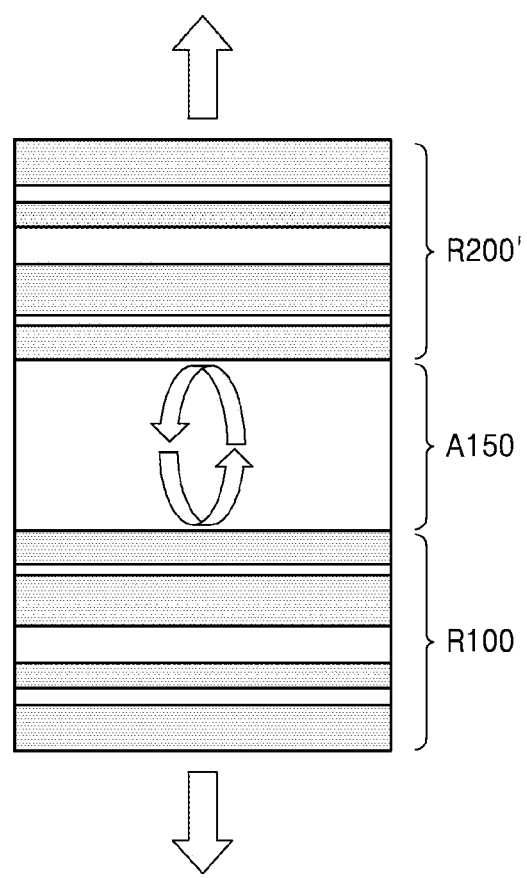
FIG. 14 is a cross-sectional view of an optical device including an electromagnetic wave reflector according to another exemplary embodiment.

FIG. 14 is a cross-sectional view of an optical device including an electromagnetic wave reflector according to another exemplary embodiment.

Referring to FIG. 14, a first reflective layer R100 and a second reflective layer R200' may have stacked structures that are symmetric with respect to an active layer A150. In other words, the second reflective layer R200' may have the same combination of layers as the first reflective layer R100, but with the layers disposed in an opposite direction, from top to bottom, as compared to from bottom to top. As such, when the first reflective layer R100 and the second reflective layer R200' have mutually symmetric stacked structures, a superior inner resonance efficiency and a high laser extraction efficiency may be easily obtained. That is, superior inner resonance efficiency may be obtained by the symmetric structures of the first reflective layer R100 and the second reflective layer R200', and excellent laser extraction efficiency may be guaranteed by the non-periodic/aperiodic structure inside each of the reflective layers R100 and R200'. In the optical device according to the exemplary embodiment shown in FIG. 14, the laser may output a laser beam both above and under the optical device, that is, in both directions. When necessary, at least one of the laser beams output in the both directions may be used.

According to another exemplary embodiment, one of the first reflective layer R100 and the second reflective layer R200 or R200' may be replaced with another structure in the optical devices shown in FIGS. 13 and 14. In other words, one of the first reflective layer R100 and the second reflective layer R200 or R200' may be replaced with another structure which is not a non-periodic/aperiodic structure as shown in FIGS. 1 through 10. The another structure may include, for example, a metallic material layer. Such modified examples are shown in FIGS. 15 and 16.

Figure 15:
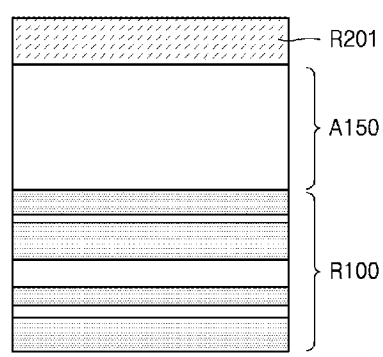
FIG. 15 is a cross-sectional view of an optical device including an electromagnetic wave reflector according to another exemplary embodiment.
Figure 16:
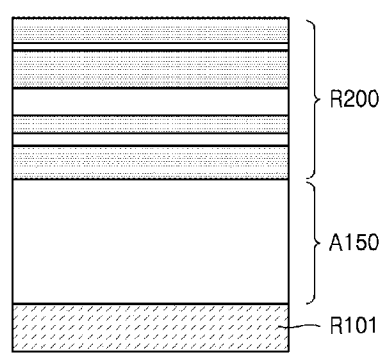
FIG. 16 is a cross-sectional view of an optical device including an electromagnetic wave reflector according to another exemplary embodiment.

FIG. 15 is a cross-sectional view of the optical device of FIG. 13 in which the second reflective layer R200 is replaced with a reflective layer R201 including a metallic material, and FIG. 16 is a cross-sectional view of the optical device of FIG. 13 in which the first reflective layer R100 is replaced with a reflective layer R101 including a metallic material. In FIGS. 15 and 16, the reflective layers R101 and R201 including a metallic material may have a single-layer or multi-layer structure.

The optical devices according to the exemplary embodiments described with reference to FIGS. 13 through 16 are merely exemplary, and may be modified in any of various ways. For example, at least one additional material layer may be further included between the first reflective layer R100 and the active layer A150 and/or the second reflective layer R200 or R200' and the active layer A150. At least one additional material layer may be further included on a bottom surface of the first reflective layer R100 and/or a top surface of the second reflective layer R200 or R200'. Such modified structures would be easily understood by those of ordinary skill in the art, and thus will not be described in detail.

Figure 17:
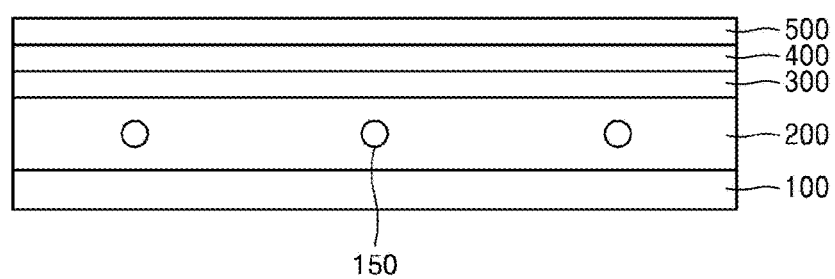
FIG. 17 is a cross-sectional view of an optical device including an electromagnetic wave reflector according to another exemplary embodiment.

FIG. 17 is a cross-sectional view of an optical device including an electromagnetic wave reflector according to another exemplary embodiment. The optical device according to the current embodiment may be a backlight unit.

Referring to FIG. 17, the optical device (backlight unit) may include a reflecting plate 100 and a waveguide 200 provided on the reflecting plate 100. The optical device (backlight unit) may include one or more light sources 150. Each of the light sources 150 may be a light-emitting diode (LED), a lamp, or another light emitter (light-emitting device). Light output from the light sources 150 is incident on and reflected by the reflecting plate 100, in the upward direction as shown in FIG. 17. Although the light sources 150 are illustrated for convenience as being disposed within the waveguide 200, alternately, the light sources 150 may be disposed adjacent to a side surface portion of the waveguide 200. On the waveguide 200, a diffusion sheet 300, a prism sheet 400, and a protection sheet 500 may be sequentially provided. In the optical device (backlight unit), the reflecting plate 100 may have a stacked structure according to one of the exemplary embodiments described with reference to FIGS. 1 through 10. The structure of the optical device (backlight unit) shown in FIG. 17 is an example and may be modified in any of various ways.

The optical device including the reflecting plate (also called a reflective layer has been described with reference to FIGS. 13 through 17, but the exemplary embodiment is not limited thereto, and the optical device may any of various types of optical devices. For example, a reflector structure according to an exemplary embodiment may be utilized in any optical device using reflection characteristics or reflection/transmission characteristics. A reflector according one of the exemplary embodiments may be used in place of a conventional DBR mirror or HCG mirror and may also be used as an ultra-mini mirror in an integrated photonic chip (IPC). In particular, when the reflector is manufactured using a silicon (Si)-based material, a high-efficiency ultra-mini/thin-film mirror may be manufactured using a simple process and requiring a low cost by using Si-based semiconductor processing. Moreover, a reflector and an optical device according to an exemplary embodiment may be applied to a quantum computer or a quantum encryption/information device having an IPC mounted thereon. A reflector and an optical device according to an exemplary embodiment may be applied to any of various devices that are mounted on cellular phones or next-generation flexible displays to obtain a camera or mobile healthcare function. A reflector and an optical device according to an exemplary embodiment may also be applied to any of various devices such as an ultra-mini light source, a polarizer, and so forth.

Although many details are disclosed in the above description, they should be construed as examples of detailed embodiments, rather than as limiting the scope of the present disclosure. For example, those of ordinary skill in the art would recognize that the structures of the electromagnetic wave reflectors described with reference to FIGS. 1, 4, and 6 through 10 may be modified in any of various ways. In addition, it would be understood by those of ordinary skill in the art that the structures of the optical devices described with reference to FIGS. 13 through 17 may also be changed, and the field of devices to which the reflectors are applied may be changed. Therefore, the scope of the present disclosure should be defined by the technical spirit of the claims, rather than by the described exemplary embodiments.

It should be understood that embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An electromagnetic wave reflector comprising:
a multi-layer structure comprising:
  a plurality of first material layers, each of the plurality of first material layers comprising a first material having a first refractive index, wherein all of the plurality of first material layers comprise a same material; and
  a plurality of second material layers, each comprising a second material having a second refractive index smaller than the first refractive index,
  wherein the plurality of first material layers are stacked alternately with the plurality of second material layers,
  at least a first one of the plurality of first material layers has a thickness that is different from a thickness of at least a second one of the plurality of first material layers,
  at least a first one of the plurality of second material layers has a thickness that is different from a thickness of at least a second one of the plurality of second material layers,
  at least one of the plurality of first material layers has a thickness that is different from a thickness of at least one of the plurality of second material layers,
  the plurality of first material layers comprise a first layer and a second layer, wherein the second layer is farther from an incident surface of the electromagnetic wave reflector than the first layer, and the second layer has a thickness that is smaller than a thickness of the first layer,
  a largest thickness of the plurality of first material layers is greater than a smallest thickness of the plurality of second material layers, wherein one layer of the plurality of second material layers having the smallest thickness is arranged between two of the plurality of first material layers, one of the plurality of first material layers is present at each end of the multi-layer structure according to a stacking direction thereof, the plurality of first material layers comprise a primary layer, a secondary layer, a tertiary layer and a quaternary layer which are sequentially arranged from the incident surface with no intervening first material layer therebetween, the primary layer directly contacting the incident surface, the plurality of first material layers are disposed such that one of:
  the thicknesses of the primary layer, the secondary layer, the tertiary layer and the quaternary layer increases, decreases, and increases again in an order from the incident surface to a surface opposite the incident surface, and
  the thicknesses of the primary layer, the secondary layer, the tertiary layer and the quaternary layer decreases, increases, and increases again in the order from the incident surface to the surface opposite the incident surface, a reflectance of the multi-layer structure is equal to or greater than 90%, and a total number of layers of the multi-layer structure is equal to or less than 15.

2. The electromagnetic wave reflector of claim 1, wherein three of the plurality of first material layers have three different thicknesses, respectively.

3. The electromagnetic wave reflector of claim 1, wherein three of the plurality of second material layers have three different thicknesses, respectively.

4. The electromagnetic wave reflector of claim 1, wherein each of the plurality of first material layers and the plurality of second material layers of the multi-layer structure has a thickness that is different from thicknesses of each other of the plurality of first material layers and the plurality of second material layers of the multi-layer structure.

5. The electromagnetic wave reflector of claim 1, wherein the first material comprises one of a dielectric and a semiconductor.

6. The electromagnetic wave reflector of claim 1, wherein the first material comprises one of AlGaAs, GaAs, AlAs, InGaAlAs, AlGaInAs, and InP.

7. The electromagnetic wave reflector of claim 1, wherein the first material comprises one of Si, Ge, SiOx, SiNx, and an oxide semiconductor comprising at least one of Zn, In, Ga, and Sn.

8. The electromagnetic wave reflector of claim 7, wherein the first material is Si and the second material is SiO2.

9. The electromagnetic wave reflector of claim 1, wherein the multi-layer structure further comprises at least one third material layer.

10. The electromagnetic wave reflector of claim 9, wherein the multi-layer structure further comprises at least one fourth material layer.

11. The electromagnetic wave reflector of claim 1, wherein a total thickness of the multi-layer structure is smaller than about 5 μm.

12. An optical device comprising the electromagnetic wave reflector of claim 1.

13. The electromagnetic wave reflector of claim 1, wherein the one layer of the plurality of second material layers having the smallest thickness is in direct contact with the primary layer.

14. An electromagnetic wave reflector comprising:
a multi-layer structure comprising a plurality of stacked layers comprising a plurality of first material layers stacked alternately with a plurality of second material layers,
wherein at least three layers of the multi-layer structure have different thicknesses from one another to satisfy a spatial coherence condition,
a total number of the plurality of stacked layers is equal to or less than 15, and
a reflectance of the multi-layer structure is equal to or higher than 90%,
each of the plurality of first material layers comprises a first material having a first refractive index, and each of the plurality of second material layers comprises a second material having a second refractive index smaller than the first refractive index, wherein all of the plurality of first material layers comprise a same material,
the plurality of first material layers comprise a first layer and a second layer, wherein the second layer is farther from an incident surface of the electromagnetic wave reflector than the first layer, and the second layer has a thickness that is smaller than a thickness of the first layer,
a largest thickness of the plurality of first material layers is greater than a smallest thickness of the plurality of second material layers, wherein one layer of the plurality of second material layers having the smallest thickness is arranged between two of the plurality of first material layers,
one of the plurality of first material layers is present at each end of the multi-layer structure according to a stacking direction thereof,
the plurality of first material layers comprise a primary layer, a secondary layer, a tertiary layer and a quaternary layer which are sequentially arranged from the incident surface with no intervening first material layer therebetween, the primary layer directly contacting the incident surface, and
the plurality of first material layers are disposed such that one of:
  the thickness of the primary layer, the secondary layer, the tertiary layer and the quaternary layer increases, decreases, and increases again in an order from the incident surface to a surface opposite the incident surface, and
  the thicknesses of the primary layer, the secondary layer, the tertiary layer and the quaternary layer decreases, increases, and increases again in the order from the incident surface to the surface opposite the incident surface.

15. The electromagnetic wave reflector of claim 14, wherein a total thickness of the multi-layer structure is smaller than about 5 μm.

16. The electromagnetic wave reflector of claim 14, wherein:
at least a first one of the plurality of first material layers has a thickness different from a thickness of a second one of the plurality of first material layers, and
at least a first one of the plurality of second material layers has a thickness different from a thicknesses of a second one of the plurality of second material layers.

17. The electromagnetic wave reflector of claim 16, wherein the multi-layer structure further comprises at least one third material layer.

18. The electromagnetic wave reflector of claim 14, wherein each of the plurality of stacked layers of the multi-layer structure has a thickness that is different from thicknesses of each other of the plurality of stacked layers of the multi-layer structure.

19. An optical device comprising the electromagnetic wave reflector of claim 14.

20. An optical device comprising:
a first reflective layer;
a second reflective layer spaced apart from the first reflective layer; and
an active layer disposed between the first reflective layer and the second reflective layer,
wherein the first reflective layer comprises a multi-layer structure comprising:
  a plurality of first material layers, each comprising a first material having a first refractive index, wherein all of the plurality of first material layers comprise a same material, and
  a plurality of second material layers, each comprising a second material having a second refractive index smaller than from the first refractive index,
  wherein a first one of the plurality of first material layers has a thickness that is different from a thickness of a second one of the plurality of first material layers,
  wherein a first one of the plurality of second material layers has a thickness that is different from a thickness of a second one of the plurality of second material layers,
  wherein at least one of the plurality of first material layers has a thickness that is different from a thickness of at least one of the plurality of second material layers,
  the plurality of first material layers comprise a first layer and a second layer, wherein the second layer is farther from an incident surface of the first reflective layer than the first layer, and the second layer has a thickness that is smaller than a thickness the first layer,
  a largest thickness of the plurality of first material layers is greater than a smallest thickness of the plurality of second material layers, wherein one layer of the plurality of second material layers having the smallest thickness is arranged between two of the plurality of first material layers,
  one of the plurality of first material layers is present at each end of the multi-layer structure according to a stacking direction thereof,
  the plurality of first material layers comprise a primary layer, a secondary layer, a tertiary layer and a quaternary layer which are sequentially arranged from the incident surface with no intervening first material layer therebetween, the primary layer directly contacting the incident surface,
  the plurality of first material layers are disposed such that one of:
    the thicknesses of the primary layer, the secondary layer, the tertiary layer and the quaternary layer increases, decreases, and increases again in an order from the incident surface to a surface opposite the incident surface, and
    the thicknesses of the primary layer, the secondary layer, the tertiary layer and the quaternary layer decreases, increases, and increases again in the order from the incident surface to the surface opposite the incident surface,
a reflectance of the multi-layer structure is equal to or higher than 90%, and
a total number of stacked layers of the multi-layer structure is equal to or less than 15.

21. The optical device of claim 20, wherein:
the multi-layer structure is a first multi-layer structure,
the second reflective layer comprises a second multi-layer structure comprising:
  a plurality of first material layers, each comprising a first material having a first refractive index, and
  a plurality of second material layers, each comprising a second material having a second refractive index, different from the first refractive index,
  wherein a first one of the plurality of first material layers has a thickness that is different from a thickness of a second one of the plurality of first material layers,
  wherein a first one of the plurality of second material layers has a thickness that is different from a thickness of a second one of the plurality of second material layers, and
wherein at least one of the plurality of first material layers has a thickness that is different from a thickness of at least one of the plurality of second material layers.

22. The optical device of claim 21, wherein the first multi-layer structure and the second multi-layer structure have stacked structures which are symmetrical to each other with respect to the active layer.

23. The optical device of claim 21, wherein
the first multi-layer structure and the second multi-layer structure have the same stacked structures with respect to a bottom surface of the optical device.

24. The optical device of claim 20, wherein the first reflective layer and the second reflective layer have the same structure and the same thickness.

25. The optical device of claim 20, wherein the second reflective layer comprises a metallic material layer.

26. The optical device of claim 20, wherein three layers of the multi-layer structure have three different thicknesses, respectively.

27. The optical device of claim 20, wherein a total thickness of the multi-layer structure is smaller than about 5 μm.

28. The optical device of claim 20, wherein the optical device comprises a surface-emitting laser device.

* * * * *